(12) United States Patent
Kang et al.

(10) Patent No.: US 9,680,126 B2
(45) Date of Patent: Jun. 13, 2017

(54) ORGANIC LIGHT EMITTING DIODE

(71) Applicant: LG DISPLAY CO., LTD., Seoul (KR)

(72) Inventors: Tae-Cheol Kang, Asan-si (KR); Gi-Hyon Jun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/711,399

(22) Filed: May 13, 2015

(65) Prior Publication Data

US 2015/0340640 A1  Nov. 26, 2015

(30) Foreign Application Priority Data

May 21, 2014  (KR) .................. 10-2014-0061125

(51) Int. Cl.
  *H01L 51/52*  (2006.01)

(52) U.S. Cl.
  CPC ........ *H01L 51/5246* (2013.01); *H01L 51/524* (2013.01); *H01L 51/525* (2013.01); *H01L 51/529* (2013.01); *H01L 51/5243* (2013.01)

(58) Field of Classification Search
  CPC ............... H01L 51/5246; H01L 51/529; H01L 51/5243; H01L 51/524; H01L 51/525
  See application file for complete search history.

(56) References Cited

U.S. PATENT DOCUMENTS

| | | | |
|---|---|---|---|
| 2007/0001931 A1* | 1/2007 | Ma | H05K 7/20963 345/60 |
| 2010/0156763 A1 | 6/2010 | Lee et al. | |
| 2010/0176751 A1* | 7/2010 | Oshio | H01L 33/62 315/362 |
| 2010/0244005 A1 | 9/2010 | Gyoda | |
| 2011/0109596 A1* | 5/2011 | Yoon | H01L 27/3272 345/204 |
| 2011/0261290 A1* | 10/2011 | Kim | G02B 6/0021 349/64 |
| 2013/0207946 A1* | 8/2013 | Kim | G09G 3/3225 345/204 |

FOREIGN PATENT DOCUMENTS

| | | |
|---|---|---|
| CN | 101763777 A | 6/2010 |
| CN | 101779303 A | 7/2010 |
| CN | 101847651 A | 9/2010 |
| CN | 102054398 A | 5/2011 |
| CN | 102236206 A | 11/2011 |
| CN | 103247235 A | 8/2013 |
| CN | 203192327 U | 9/2013 |
| EP | 2682839 A2 | 1/2014 |
| TW | 200703405 A | 1/2007 |
| WO | 2013170503 A1 | 11/2013 |

\* cited by examiner

*Primary Examiner* — Kyoung Lee
(74) *Attorney, Agent, or Firm* — Dentons US LLP (57) ABSTRACT

Disclosed is an organic light emitting diode (OLED) that includes an OLED panel; a back cover supporting the OLED panel and including a reinforcing bent portion; and a heat dissipation member between the OLED panel and the back cover.

10 Claims, 5 Drawing Sheets

ORGANIC LIGHT EMITTING DIODE

The present application claims the priority benefit of Korean Patent Application No. 10-2014-0061125 filed in Republic of Korea on May 21, 2014, which is hereby incorporated by reference in its entirety for all purposes as if fully set forth herein.

BACKGROUND OF THE INVENTION

Field of the Invention

The present invention relates to an organic light emitting diode (OLED). In particular, the present invention relates to an OLED that can have an excellent rigidity and effective heat dissipation design.

Discussion of the Related Art

An OLED includes a hole injection electrode, an organic light emission layer and an electron injection electrode, and emits light by an energy produced when an exciton generated by combination of electrode and hole transits from an excited state to a ground state.

According to this principle, the OLED has a self-luminous property, and the OLED decreases the thickness and weight of a display device because the OLED does not require a light source. Further, since the OLED has high qualities such as low power consumption, high brightness and high response speed, the OLED is considered as a next generation display device.

Generally, the OLED includes an OLED panel having an organic light emitting layer, and a back cover supporting the OLED panel.

Since the OLED has a self-luminous property, when the OLED is operated over a long period of time, the organic light emitting layer is deteriorated due to internally produced heat. Thus, the OLED is denaturalized and decomposed.

Accordingly, brightness deviation between pixels occurs, and degradation of display quality such as afterimage and reduction of lifetime are caused. In particular, the deterioration problem becomes more noticeable as the OLED increases in size.

Further, since a number of components of the OLED is less than that of an liquid crystal display, the OLED can have lightweight and thin profile, but the OLED is less rigid than the LCD.

SUMMARY OF THE INVENTION

Accordingly, the present invention is directed to an OLED that can have an heat dissipation design to effectively dissipate heat produced from the OLED to the outside, and improve a rigidity without an increase of production cost.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present invention, as embodied and broadly described herein, an organic light emitting diode (OLED) includes an OLED panel; a back cover supporting the OLED panel and including a reinforcing bent portion; and a heat dissipation member between the OLED panel and the back cover.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE ILLUSTRATED EMBODIMENTS

Reference will now be made in detail to embodiments, examples of which are illustrated in the accompanying drawings.

Figure 1:
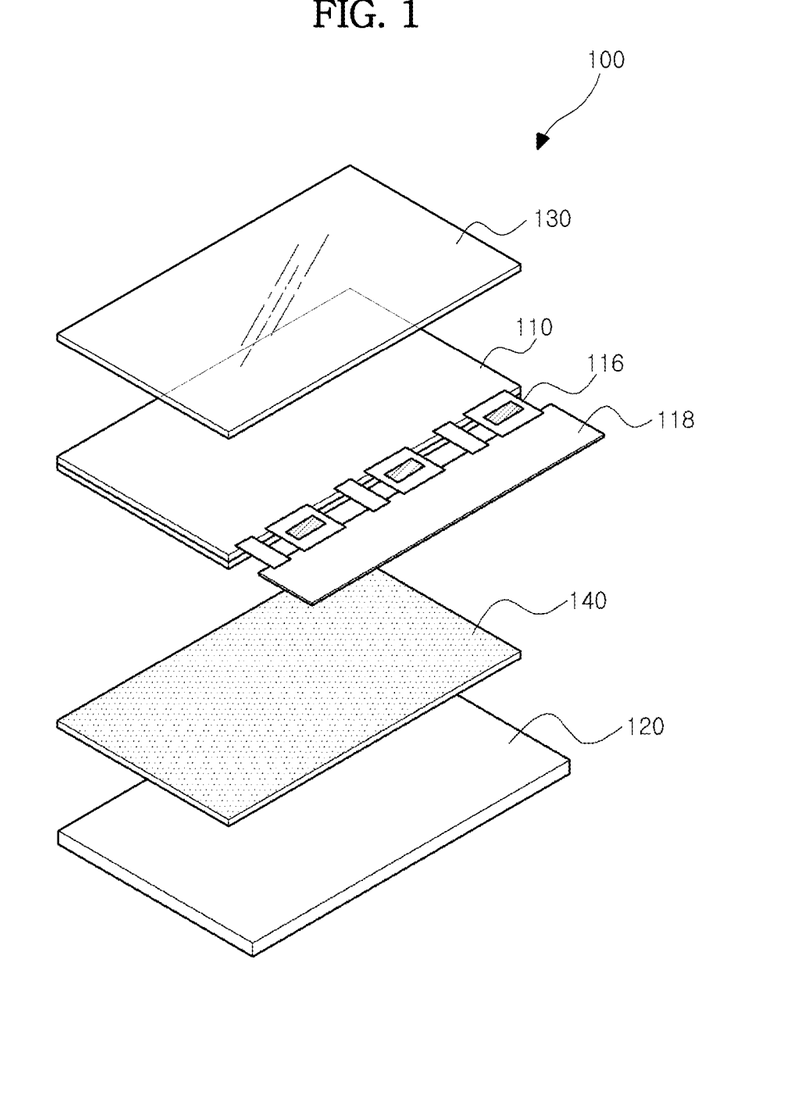
FIG. 1 is a schematic perspective view illustrating an OLED according to an embodiment of the present invention.
Figure 2:
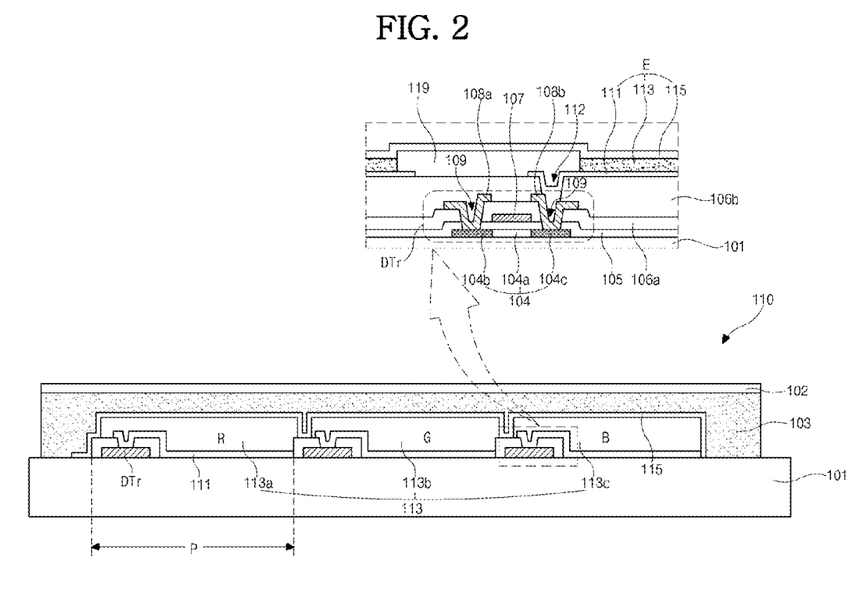
FIG. 2 is a schematic cross-sectional view of the OLED of FIG. 1.

FIG. 1 is a schematic perspective view illustrating an OLED according to an embodiment of the present invention, and FIG. 2 is a schematic cross-sectional view of the OLED of FIG. 1.

Referring to FIGS. 1 and 2, the OLED 100 includes an OLED panel 110 to display images, a back cover 120 supporting the OLED panel 110, a heat dissipation member 140 dissipating heat produced from the OLED panel 110, and a cover window 130 protecting the OLED panel 110.

For the purpose of explanation, regarding directions of the components in the drawings, when it is assumed that a display surface of the OLED panel 110 heads for front, the back cover 120 is disposed on the rear of the OLED panel 110, and the cover window 130 is disposed on the front of the OLED panel 110. The OLED panel 110 is coupled with the back cover 120 at the rear thereof and the cover window 130 at the front thereof.

Referring to FIG. 2, the OLED panel 110 includes a substrate 101 having a driving thin film transistor DTr and a light emitting diode E thereon, and an encapsulation substrate 102 to encapsulate the substrate 101.

A semiconductor layer 104 is formed in a pixel region P, may be made of silicon, and includes an active region 104a as a channel at a center portion, and source and drain regions 104b and 104c located at both sides of the active region 104a and highly doped with impurities.

A gate insulating layer 105 is formed on the semiconductor layer 104.

A gate electrode 107 corresponding to the active region 104a and a gate line (not shown) extending along a direction are formed on the gate insulating layer 105.

A first inter-layered insulating layer 106a is formed entirely on the gate electrode 107 and the gate line. The first inter-layered insulating layer 106a and the gate insulating layer 105 includes first and second semiconductor contact holes 109 exposing the source and drain regions 104b and 104c.

Source and drain electrodes 108a and 108b spaced apart from each other are formed on the first inter-layered insulating layer 106a and contact the source and drain regions 104b and 104c through the first and second semiconductor contact holes 109.

A second inter-layered insulating layer 106b is formed on the source and drain electrodes 108a and 108b and the first inter-layered insulating layer 106a, and includes a drain contact hole 112 exposing the drain electrode 108b.

The source and drain electrodes 108a and 108b, the semiconductor layer 104, and the gate insulating layer 105 and the gate electrode on the semiconductor layer 104 form the driving thin film transistor DTr.

Even though not shown in the drawings, a data line crossing the gate line to define a pixel region P is formed on the substrate 101. A switching thin film transistor connected to the driving thin film transistor DTr is formed on the substrate 101, and may have substantially the same structure as the driving thin film transistor DTr.

In this embodiment, the switching thin film transistor and the driving thin film transistor DTr having a coplanar structure using the semiconductor layer 104 of poly silicon are described. Alternatively, the transistors may have another structure, for example, a bottom gate structure using intrinsic and extrinsic amorphous silicons.

A first electrode 111 as a component of the light emitting diode E is formed on the second inter-layered insulating layer 106b in each pixel region P and connected to the drain electrode 108b through the drain contact hole 112. The first electrode 111 may be an anode and be made of a material having a relatively high work function.

A bank 119 is formed between the first electrodes 111 of neighboring pixel regions P.

In other words, the first electrodes 111 of the pixel regions P are separated from each other with the bank 119 as a boundary of each pixel region P.

An organic light emitting layer 113 is formed on the first electrode 111.

The organic light emitting layer 113 may have a single-layered structure using a light emitting material, or may have a multi-layered structure, which includes a hole injection layer, a hole transport layer, an emitting material layer, an electron transport layer, and an electron injection layer, in order to increase light emission efficiency.

The organic light emitting layers 113 may emit red (R), green (G) and blue (B) lights in respective pixel regions P. For example, the organic light emitting layers 113 may include red, green and blue light emitting layers 113a, 113b and 113c emitting red, green and blue lights in the pixel regions P, respectively.

A second electrode 115 is formed on the organic light emitting layer 113 and may be a cathode.

The second electrode 115 may have a double-layered structure including a relatively thin-deposited semi-transparent metal layer having a relatively low work function. In this case, the second electrode 115 may include a relatively thick-deposited transparent conductive material layer on the semi-transparent metal layer.

Accordingly, light emitted from the organic light emitting layer 113 travels through the second electrode 115 so that the OLED panel 110 is operated in a top emission type.

Alternatively, the second electrode 115 is made of opaque metal material, and thus light emitted from the organic light emitting layer 113 travels through the first electrode 111 so that the OLED panel 110 is operated in a bottom emission type.

In the OLED panel 110, voltages are applied to the first and second electrodes 111 and 115 according to a data signal, a hole injected from the first electrode 111 and an electron from the second electrode 115 are transported to the organic light emitting layer 113 to form an exciton, and when the exciton transits from an excited state to a ground state, light is produced and emitted.

The emitted light passes through the first electrode 111 or second electrode 115 to the outside so that the OLED panel 110 displays an image.

The encapsulation substrate 102 is disposed over the driving thin film transistor DTr and the light emitting diode E, and the substrate 101 and the encapsulation substrate 102 may be coupled with each other using the adhesive film 103.

Accordingly, the OLED panel 110 is encapsulated.

The adhesive film 103 functions to prevent an external moisture from penetrating into the light emitting diode E and protect the driving thin film transistor DTr and the light emitting diode E. The adhesive film 103 may enclose the light emitting diode E and be formed on the substrate 101.

The adhesive film 103 may be made of one of an OCA (optical cleared adhesive) material, a thermosetting resin and a thermosetting sealant to seal the driving thin film transistor DTr and the light emitting diode E.

The substrate 101 and the encapsulation substrate 102 may be made of glass, plastic material, stainless steel, metal foil or the like.

The printed circuit board 118 (FIG. 1) is connected to an edge portion of the OLED panel 110 through a connection member 116 such as a flexible printed circuit film or TCP (tape carrier package) film.

The OLED panel 110 is supplied with driving signals from driving circuit elements mounted on the printed circuit board 118.

The OLED panel 110 is modulized with the back cover 120 and the cover window 130. The back cover 120 may have a plate shape covering the rear surface of the OLED panel 110, and the OLED panel 110 is placed on and attached to the back cover 120.

The back cover 120 includes a reinforcing bent portion (123 of FIG. 3A) to protect the OLED panel 110 and give the OLED panel 110 a rigidity. The reinforcing bent portion 123 may be referred to as a furring bamboo or a forming.

The cover window 130 is coupled with the OLED panel 110 at the front of the OLED panel 110. The window cover 130 may be attached to the OLED panel 110 using a double-sided adhesive film.

The cover window 130 functions to protect the OLED panel 110 from an external impact, and transmit light from the OLED panel 110.

The cover window 130 may be made of a material having shock resistance and light transmission, for example, plastic material such as acrylic, or glass.

Accordingly, the OLED panel 110 is coupled with the cover window 130 on the front thereof and the back cover 120 on the rear thereof.

The back cover 120 may be referred to as a cover bottom, bottom cover or rear cover.

In this embodiment, the heat dissipation member 140 is interposed between the OLED panel 110 and the back cover 120 so that heat produced from the OLED panel 110 can be effectively released to the outside.

In other words, when the OLED panel 110 is operated, a temperature of the OLED panel 110 rises up to about 80-90 degrees Celsius by a heat produced together with deterioration of the driving thin film transistor DTr. By such a high-temperature heat, a lifetime of the OLED panel 110 is sharply reduced.

Accordingly, since the heat dissipation member 140 is employed at a non-display surface i.e., the rear surface of the OLED panel 110, a high-temperature heat from the OLED panel 110 can be effectively dissipated to the outside. Thus, brightness deviation between pixels, degradation of display quality such as afterimage, and reduction of lifetime can be prevented.

Particularly, even though the reinforcing bent portion (123 of FIG. 3A) is formed in the back cover 120, the OLED 100 can effectively dissipate high-temperature heat from the OLED panel 110 to the outside. Accordingly, occurrence of heat dissipation step can be prevented.

In other words, by forming the reinforcing bent portion (123 of FIG. 3A), rigidity of the back cover 120 and overall rigidity of the OLED 100 as well can be improved, and by using the heat dissipation member 140 on the rear surface of the OLED panel 110, high-temperature heat from the OLED panel 110 can be effectively dissipated to the outside through the heat dissipation member 140. Particularly, even though the reinforcing bent portion (123 of FIG. 3A) is formed in the back cover 120, heat dissipation step can be prevented from happening.

Figure 3A:
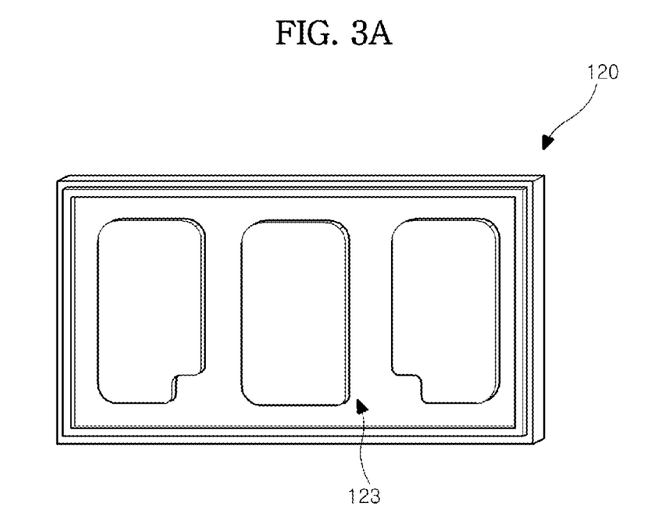
FIG. 3A is a schematic front view of a back cover according to the embodiment of the present invention.
Figure 3B:
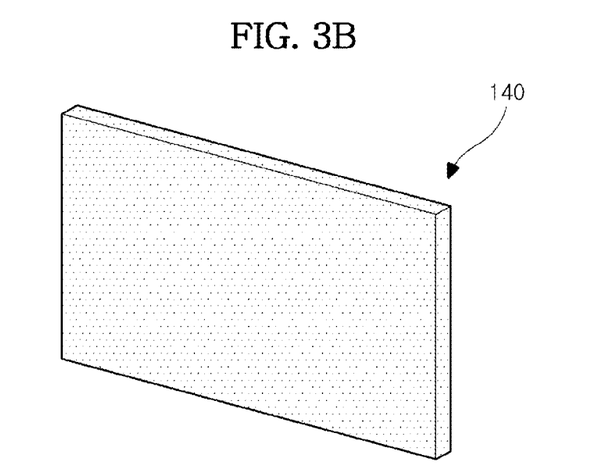
FIG. 3B is a schematic perspective view of a heat dissipation member according to the embodiment of the present invention.
Figure 4A:
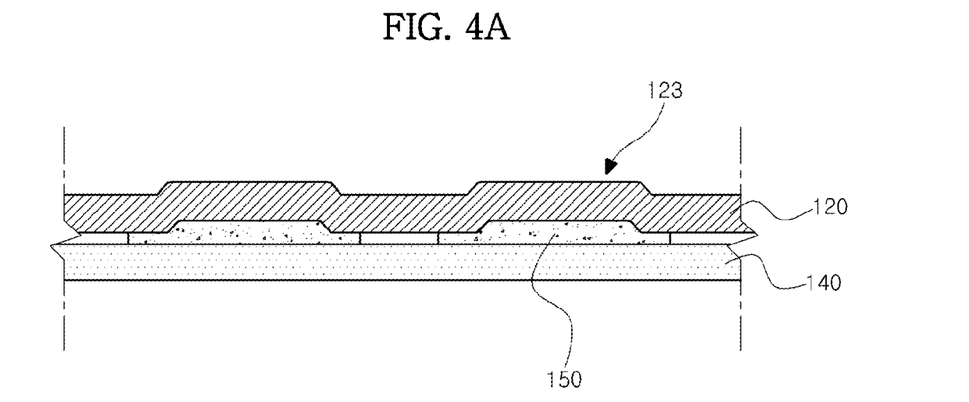
FIGS. 4A to 4C are schematic cross-sectional views illustrating examples of coupling a back cover with a heat dissipation member according to the embodiment of the present invention.
Figure 4B:
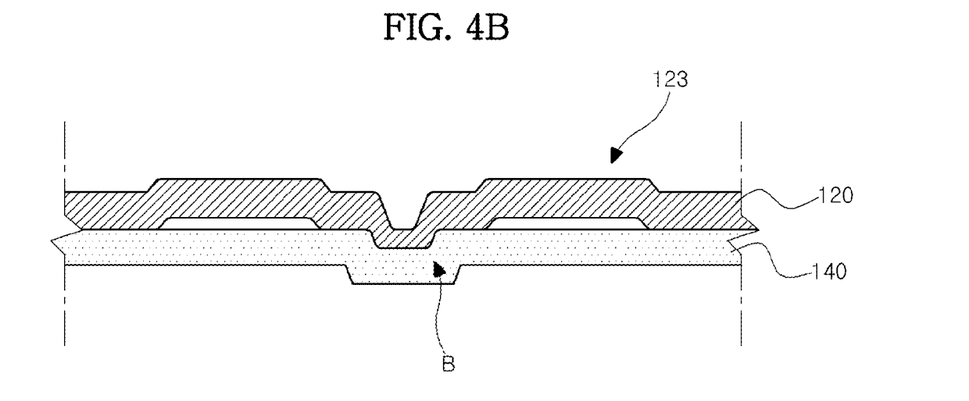
Figure 4C:
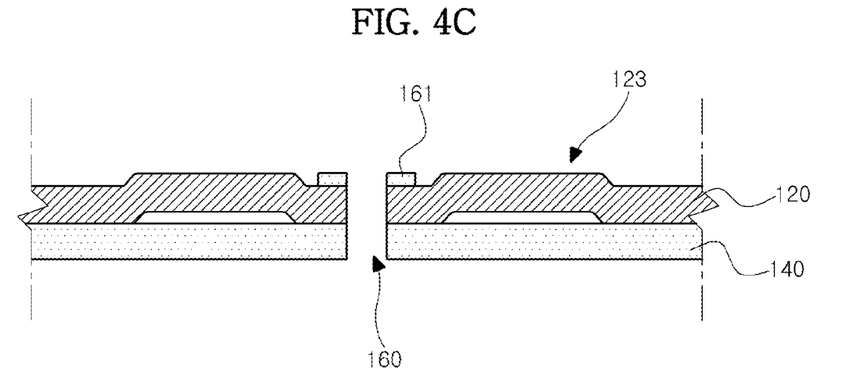

FIG. 3A is a schematic front view of a back cover according to the embodiment of the present invention, and FIG. 3B is a schematic perspective view of a heat dissipation member according to the embodiment of the present invention. FIGS. 4A to 4C are schematic cross-sectional views illustrating examples of coupling a back cover with a heat dissipation member according to the embodiment of the present invention.

Referring to FIG. 3A, the back cover 120 has substantially a plate shape.

The back cover 120 may be formed by a press work to apply a predetermined force to a raw material to modify and process the material. Aluminum (Al), SUS (steel us stainless), CGI (cold galvanized steel sheet), or EGI (electrolytic galvanized steel sheet) may be used as the raw material of the back cover 120. Among these materials, the EGI is preferred because the EGI has an excellent competitiveness in cost and productivity.

Accordingly, production cost of the OLED 100 can be minimized.

Further, the back cover 120 has the reinforcing bent portion 123 referred to as a furring strips or forming in order to give the OLED 100 rigidity, and the reinforcing bent portion 123 is formed to have a step that is produced by performing a press work for a die.

Since a rigidity of the back cover 120 is improved by the reinforcing bent portion 123, the OLED panel 110 can be protected from an external impact.

The heat dissipation member 140 is located between an inner side of the back cover 120 and the OLED panel 110. Referring to FIG. 3B, the heat dissipation member 140 may have a rectangular plate shape corresponding to the rear surface of the OLED panel 110, and may be formed of a metal plate using at least one of copper (Cu), silver (Ag), aluminum (Al), iron (Fe), nickel (Ni) and tungsten (W), or an alloy including at least one thereof.

Alternatively, an outer surface of the heat dissipation member 140 may be plated with at least one of nickel (Ni), silver (Ag) and gold (Au) or an alloy including at least one thereof.

When the heat dissipation member 140 is made of aluminum having an excellent thermal conductivity, the purity of aluminum may be about 99.5%, and anodizing treatment may be performed to form an anodized film in black color at a surface of the heat dissipation member 140. Since the anodized heat dissipation member 140 has black color, a thermal absorptance increases and thus the heat dissipation member 140 has high thermal conductivity.

Alternatively, the heat dissipation member 140 may be made of silicone composition having an excellent thermal conductivity. Alternatively, the heat dissipation member 140 may be formed using a thermal pad that includes resin composition containing heat transfer filler, and in this case, epoxy may be used as resin of the compound, and the heat transfer filler may be formed in a power form of a material having an excellent conductivity, such as aluminum (Al), graphite, or copper (Cu).

It is preferred that the heat dissipation member 140 has a plate shape in order to prevent heat dissipation step from happening.

The back cover 120 and the heat dissipation member 140 may be attached to each other using a double-sided adhesive tape, or coupled with each other through a TOX joining method or burring joining method.

When the heat dissipation member 140 is formed using the silicone composition or resin composition containing the heat transfer filler, the heat dissipation member 140 and the back cover 120 may be coupled with each other through a double-sided adhesive tape 150, as shown in FIG. 4A.

In this case, the double-sided adhesive tape may be made of a ductile material having an adhesive property, for example, TIM (thermal interface material). The TIM is excellent in interfacial property and heat transfer property, and may include silicone material.

By adhering the heat dissipation member 140 to the back cover 120 using the double-sided adhesive tape 150, a high-temperature heat from the OLED panel 110 can be effectively transferred to the back cover 120, and also an adhesion between the heat dissipation member 140 and the back cover 120 can be further improved.

In other words, since the back cover 120 has the reinforcing bent portion 123 of step shape to improve rigidity, in case that a hard type material is used for a double-sided tape, a gap region occurs between the hard double-sided adhesive tape and the back cover 120.

In this case, a contact area between the double-sided adhesive tape and the back cover 120 is reduced. Thus, detachment of the adhesive tape is caused, and an adhesion between the heat dissipation member 140 and the back cover 120 is reduced. As such, the heat dissipation member 140 is detached from the back cover 120.

However, when the TIM of a soft type material is used for the double-sided adhesive tape 150 to attach the heat dissipation member 140 to the back cover 120, the double-sided adhesive tape 150 may contact the back cover 120 covering up the reinforcing bent portion 123. Accordingly, a gap region between the double-sided adhesive tape 150 and the back cover 120 is prevented, and thus the double-sided adhesive tape 150 can be tightly adhered to the back cover 120.

Accordingly, an adhesion between the heat dissipation member 140 and the back cover 120 can be improved, and the heat dissipation member 140 can be stably adhered to the back cover 120.

The double-sided adhesive tape 150 may have substantially the same size as the heat dissipation member 140 to entirely cover a surface of the heat dissipation member 140, or may be divided into separate parts to improve efficiency of production.

In a case that the heat dissipation member 140 is formed of a metal plate, in a state that the back cover 120 and the heat dissipation member 140 are in contact with each other, the back cover 120 and the heat dissipation member 140 are joined to each other through a TOX joining B that conducts a plastic deformation, as shown in FIG. 4B. Alternatively, as shown in FIG. 4C, after a hole 160 is formed in the back cover 120 and the heat dissipation member 140, the back cover 120 and the heat dissipation member 140 are joined to each other through a burring joining that broadens a burr 161, which is formed at an edge of the hole 160, using a press punch.

In case of the TOX joining B, the back cover 120 has further step, and thus the rigidity of the back cover 120 can be further improved. In case of the burring joining, the rigidity of the back cover 120 can be further improved because of the burr 161 formed at the edge of the hole 160.

It is preferred that a plurality of TOX joint portions and a plurality of burring joint portions are formed uniformly all over the back cover 120 and the heat dissipation member 140 in order to prevent occurrence of heat dissipation step.

When the back cover 120 and the heat dissipation member 140 are coupled with each other, the OLED panel 110 is located in front of the heat dissipation member 140. The heat dissipation member 140 and the OLED panel 110 may be fixed to each other using a double-sided adhesive tape (170 of FIG. 5), resin, screw or the like, and in this case, the heat dissipation member 140 and the OLED panel 110 are spaced apart from each other.

Figure 5:
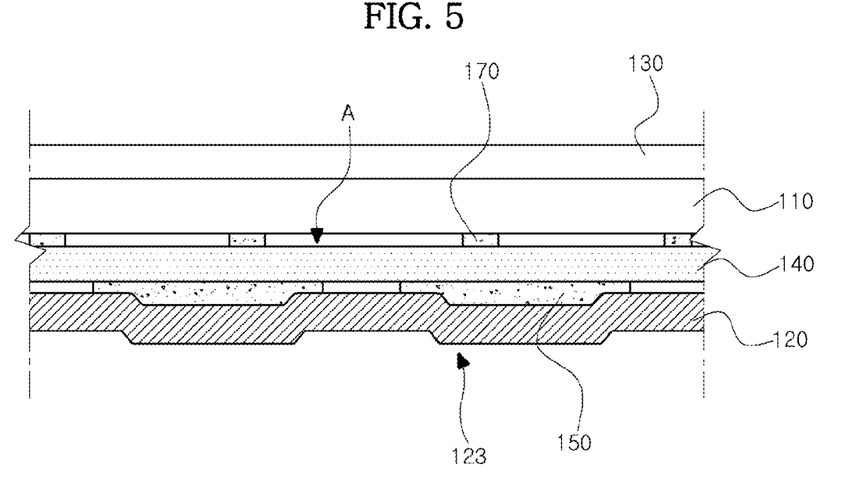
FIG. 5 is a schematic cross-sectional view illustrating a portion of a modulized OLED according to the embodiment of the present invention.
Figure 6A:
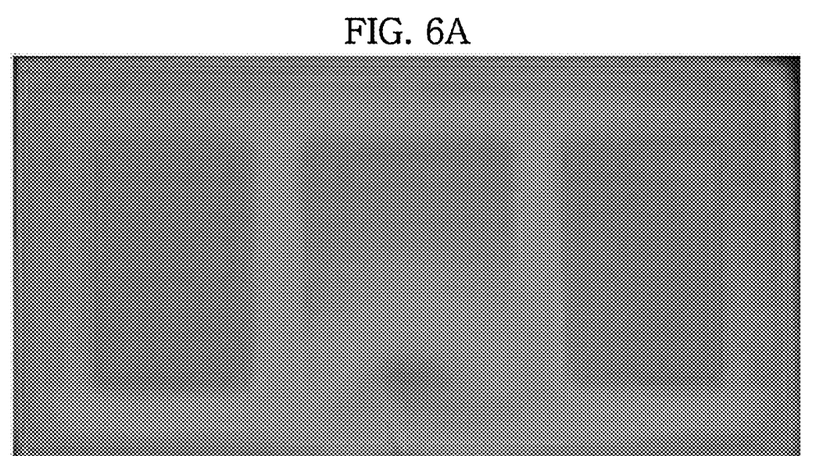
FIG. 6A is an experimental picture illustrating a case of an OLED where thermal step happens.
Figure 6B:
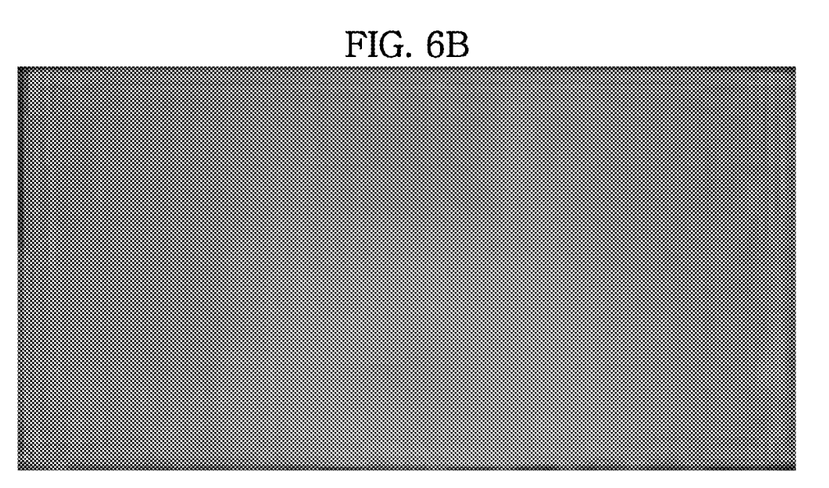
FIG. 6B is an experimental picture illustrating a case of an OLED where no thermal step happens according to the embodiment of the present invention.

FIG. 5 is a schematic cross-sectional view illustrating a portion of a modulized OLED according to the embodiment of the present invention, FIG. 6A is an experimental picture illustrating a case of an OLED where thermal step happens, and FIG. 6B is an experimental picture illustrating a case of an OLED where no thermal step happens according to the embodiment of the present invention.

Referring to FIG. 5, the heat dissipation member 140 of a plate shape is located on the back cover 120 and coupled with the back cover 120, and the OLED panel 110 is located on the heat dissipation member 140.

The cover window 130 is located in front of the OLED panel 110 and protects the OLED panel 110 from an external impact.

The back cover 120 functions to support the OLED panel 110 and also give a rigidity the OLED panel 110. The heat dissipation member 140 functions to effectively dissipate high-temperature heat produced from the OLED panel 110 to the outside.

The OLED panel 110 and the cover window 130 are closely adhered to each other using a double-sided adhesive tape. The back cover 120 and the heat dissipation member 140 are adhered to each other using the double-sided adhesive tape 150, or joined to each other using a TOX joining method or burring joining method. The heat dissipation member 140 and the OLED panel 110 are attached to each other using the double-sided adhesive tape 170. Accordingly, the OLED 100 is modulized.

The heat dissipation member 140 and the OLED panel 110 are spaced apart from each other at a predetermined distance, and thus an air gap A is formed between the OLED panel 110 and the heat dissipation member 140.

In case that the heat dissipation member 140 is not completely in contact with the back cover 120 due to an assembly tolerance, the heat dissipation member 140 presses the rear surface of the OLED panel 110, and thus a phenomenon that the OLED panel 110 is pressed happens. However, in the OLED 100 according to the embodiment, such the phenomenon can be prevented because of the air gap A formed between the heat dissipation member 140 and the OLED panel 110.

The double-sided adhesive tape 170 may be located along peripheral portions of the rear surface of the OLED panel 110 so that the OLED panel 110 and the heat dissipation member 140 are spaced apart from each other. However, it is preferred that the double-sided adhesive tape 170 includes a plurality of parts located at the peripheral portions and center portions of the rear surface of the OLED panel 110 as well in order to form a plurality of thermal conduction paths and thus more effectively transfer a high-temperature heat produced from the OLED panel 110 to the heat dissipation member 140.

Further, it is preferred that the double-sided adhesive tape 170 is made of TIM having a high thermal conductivity.

As described above, in the OLED 100 according to the embodiment, since the reinforcing bent portion 123 is formed in the back cover 120, the rigidity of the back cover 120 and the overall rigidity of the OLED 100 can be improved. Further, since the heat dissipation member 140 is disposed on the rear surface of the OLED panel 110, the high-temperature heat produced from the OLED panel 110 can be effectively dissipated to the outside through the heat dissipation member 140. Particularly, even though the reinforcing bent portion 123 is formed in the back cover 120, the incomplete dissipation of heat can be prevented from happening.

FIG. 6A shows an experimental result that a thermal step happens in case that a heat dissipation member is not used and the reinforcing bent portion 123 is formed in the back cover 120.

In case that the reinforcing bent portion 123 is formed in the back cover 120 in order to increase a rigidity of the OLED 100, due to the reinforcing bent portion 123 of the back cover 120, high-temperature heat produced from the OLED panel 110 is released differently in quantity to the outside depending on the location.

This thermal step phenomenon causes brightness deviation between pixels, and thus display quality such as after-image is caused.

To prevent the thermal step phenomenon, in case that the back cover 120 is formed in a flat plate shape, the back cover 120 is required to be formed of a material having a higher rigidity, and thus production cost of the OLED 100 increases.

However, in the embodiment, even though the reinforcing bent portion 123 is formed in the back cover 120 to improve rigidity of the back cover 120 and the OLED 100 as well, a high-temperature heat from the OLED panel 110 can be effectively dissipated to the outside through the heat dissipation member 140. Therefore, as shown in FIG. 6B, no thermal step can substantially happen.

Further, since the air gap A is formed between the OLED panel 110 and the heat dissipation member 140, a phenomenon that the heat dissipation member 140 presses the OLED panel 110 can be prevented.

The OLED 100 may include a cabinet (not shown) surrounding and supporting edges of the OLED panel 110. Further, the back cover 120 may further include side walls bent vertically from four edges of the back cover 120.

It will be apparent to those skilled in the art that various modifications and variations can be made in a display device of the present invention without departing from the sprit or scope of the disclosure. Thus, it is intended that the present invention covers the modifications and variations of this disclosure provided they come within the scope of the appended claims and their equivalents.

What is claimed is:

1. An organic light emitting diode (OLED) comprising: an OLED panel; a back cover supporting the OLED panel and including a reinforcing bent portion; and a heat dissipation member between the OLED panel and the back cover,
wherein the OLED panel and the heat dissipation member are attached to each other using a plurality of double-sided adhesive tapes corresponding to a peripheral portion and a center portion of a rear surface of the OLED panel.

2. The OLED of claim 1, wherein the back cover is formed of EGI (electrolytic galvanized steel sheet).

3. The OLED of claim 1, wherein the heat dissipation member is formed of a metal plate which includes at least one of copper (Cu), silver (Ag), aluminum (Al), iron (Fe), nickel (Ni) and tungsten (W), or an outer surface of which is plated with at least one of nickel (Ni), silver (Ag) and gold (Au).

4. The OLED of claim 1, wherein the heat dissipation member is formed of a thermal pad that includes silicone composition, or that includes resin composition containing epoxy and a heat transfer filler which includes at least one of aluminum (Al), graphite and copper (Cu).

5. The OLED of claim 3, wherein the heat dissipation member is joined to the back cover using a TOX joint formed between two adjacent step structures.

6. The OLED of claim 4, wherein the heat dissipation member is attached to the back cover using a double-sided adhesive tape made of TIM (thermal interface material).

7. The OLED of claim 1, wherein an air gap is between the OLED panel and the heat dissipation member.

8. The OLED of claim 1, further comprising a cover window in front of the OLED panel.

9. The OLED of claim 3, wherein the heat dissipation member is joined to the back cover using a burring joint formed between two adjacent step structures.

10. The OLED of claim 1, wherein the reinforcing bent portion has a step structure.

* * * * *